(12) United States Patent
Morikawa

(10) Patent No.: US 7,987,019 B2
(45) Date of Patent: Jul. 26, 2011

(54) SUBSTRATE TRANSFER METHOD AND SUBSTRATE TRANSFER APPARATUS

(75) Inventor: Katsuhiro Morikawa, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1276 days.

(21) Appl. No.: 11/563,400

(22) Filed: Nov. 27, 2006

(65) Prior Publication Data

US 2007/0128008 A1      Jun. 7, 2007

(30) Foreign Application Priority Data

Dec. 6, 2005    (JP) .................................. 2005-351397

(51) Int. Cl.
*G06F 7/00* (2006.01)
(52) U.S. Cl. ........................................ 700/218; 414/935
(58) Field of Classification Search .................. 700/218, 700/214, 213; 414/935, 936
See application file for complete search history.

(56) References Cited

U.S. PATENT DOCUMENTS

| | | | |
|---|---|---|---|
| 6,456,480 B1 * | 9/2002 | Hirose et al. .................. | 361/213 |
| 2005/0016818 A1 * | 1/2005 | Ito et al. ...................... | 198/345.1 |
| 2005/0034674 A1 * | 2/2005 | Ono .............................. | 118/728 |
| 2005/0242305 A1 * | 11/2005 | Oka ........................ | 250/559.29 |
| 2008/0006785 A1 * | 1/2008 | Chen et al. ................. | 250/559.3 |

FOREIGN PATENT DOCUMENTS

| | | |
|---|---|---|
| JP | 11-243133 | 9/1999 |
| JP | 2002-124556 | 4/2002 |
| JP | 2004-172480 | 6/2004 |

* cited by examiner

*Primary Examiner* — Gene Crawford
*Assistant Examiner* — Ramya Prakasam
(74) *Attorney, Agent, or Firm* — Oblon, Spivak, McClelland, Maier & Neustadt, L.L.P.

(57) ABSTRACT

The present invention is a substrate transfer apparatus including a transfer arm for transferring a substrate and a mounting portion for receiving the substrate transferred by the transfer arm from the transfer arm, including: a mounting portion detector provided at the transfer arm for detecting the mounting portion; a moving means for raising and lowering and moving in a horizontal direction the transfer arm; and a controller for controlling the moving means based on a detection signal from the mounting portion detector. When the substrate transferred by the transfer arm is delivered to a spin chuck, the mounting portion detector detects the mounting portion of the spin chuck, and then the moving means is driven based on a control signal from the controller to lower the transfer arm in an oblique direction to thereby mount the substrate on the mounting portion. Accordingly, it is possible to perform stable transfer and delivery of the substrate to the mounting portion at a high speed and with a high accuracy.

6 Claims, 14 Drawing Sheets

SUBSTRATE TRANSFER METHOD AND SUBSTRATE TRANSFER APPARATUS

BACKGROUND OF THE INVENTION

1. Field of the Invention

The present invention relates to a substrate transfer method and a substrate transfer apparatus and, more specifically, to a substrate transfer method and a substrate transfer apparatus for a substrate, for example, a semiconductor wafer, LCD glass substrate, or the like.

2. Description of the Related Art

Generally, in the manufacture of the semiconductor device, the photolithography technology is used to form a thin film of ITO (Indium Tin Oxide) and an electrode pattern on a semiconductor wafer, LCD glass substrate, or the like (hereinafter, referred to as a substrate). In the photolithography technology, a photoresist is applied on the substrate, a resist film formed on the substrate by the application is exposed to light according to a predetermined circuit pattern, and the exposed pattern is subjected to developing treatment to for a circuit pattern in the resist film.

To perform such a series of treatments, a coating and developing treatment apparatus has been conventionally used. In the coating and developing treatment apparatus, treatment units for performing predetermined treatments on the substrate are provided, such as surface treatment, cleaning treatment, resist coating treatment, post-exposure developing treatment, and heating treatments before and after exposure, and so on.

A transfer apparatus is used for transfer of the substrate between these units, and is provided with a transfer arm (also referred to as a pair of tweezers) which is movable in the vertical direction, horizontal direction, and the horizontal rotation direction in which the substrate is transferred (carried-in, carried-out). A support member made of a synthetic resin for supporting the substrate without causing damage to the substrate is attached to the transfer arm. Further, the support member is set to have a size slightly larger than the outer dimension of the substrate, accommodating the error in dimension of the substrate so as to support the substrate and deliver the substrate to a substrate mounting means provided in each treatment unit (Japanese Patent Application Laid-open No. H11-243133).

Incidentally, in this kind of substrate transfer, it is demanded to deliver the substrate between the transfer arm and the mounting means at a high speed and with a high accuracy in order to improve the throughput and improve the yields.

However, if the substrate is transferred (carried-in, carried-out) to/from the treatment unit at a high speed and with a high accuracy, the behavior of the transferred substrate is unstable due to the inertial force when the transfer arm is moved to the treatment unit because the support member has a size larger than the outer dimension of the substrate as described above. This causes positional displacement of the substrate to degrade the treatment accuracy. For example, the problems are that (1) the film thickness of the coating film becomes nonuniform in the coating treatment, (2) the exposure at a predetermined peripheral portion of the substrate becomes nonuniform in the peripheral exposure processing of the substrate, and (3) heating becomes nonuniform in the heating treatment, to fail to uniform the film thickness, causing a reduction in yield.

SUMMARY OF THE INVENTION

The present invention has been developed in consideration of the above circumstances, and its object is to transfer the substrate and deliver it to the mounting means at a high speed and with a high accuracy.

To attain the above object, the present invention is a substrate transfer method of delivering a substrate transferred by a transfer arm to a mounting means, including the steps of: moving the transfer arm to a position above the mounting means, and delivering the substrate onto the mounting means such that the transfer arm is lowered in an oblique direction to mount the substrate on the mounting means.

In this case, the transfer arm may be lowered in the oblique direction after a mounting portion of the mounting means is detected by a mounting portion detector provided at the transfer arm.

According to another aspect, the present invention is a substrate transfer method of delivering a substrate transferred by a transfer arm to a mounting means, including the steps of: moving the transfer arm to a position above the mounting means, and, when delivering the substrate to a support pin raised and lowered with respect to the mounting means, detecting a head portion of the support pin by a head portion detector provided at the transfer arm, then lowering the transfer arm in an oblique direction, and then lowering the support pin to mount the substrate on the mounting means.

According to still another aspect, the present invention is a substrate transfer method of delivering a substrate transferred by a transfer arm to a mounting means, including the steps of: moving the transfer arm to a position above the mounting means, mounting the substrate on the mounting means, then moving the transfer arm in a horizontal direction along a forward direction of movement of the transfer arm, and then lowering the transfer arm in a vertical direction.

In the above method, presence or absence of jump-up of the substrate in a state where the substrate is delivered on the mounting means may be detected by a substrate jump-up detector provided at the transfer arm, and if the jump-up is detected, the transfer arm may raise the substrate once and then lower the substrate to mount the substrate on the mounting means.

In this case, warning may be issued if the jump-up is detected.

A substrate transfer apparatus of the present invention is a substrate transfer apparatus including a transfer arm for transferring a substrate and a mounting means for receiving the substrate transferred by the transfer arm from the transfer arm, including: a mounting portion detector provided at the transfer arm for detecting a mounting portion of the mounting means; a moving means for raising and lowering and moving in a horizontal direction the transfer arm; and a control means for controlling the moving means based on a detection signal from the mounting portion detector. In addition, when the substrate transferred by the transfer arm is delivered to the mounting means, the mounting portion detector detects the mounting portion of the mounting means, and then the moving means is driven based on a control signal from the control means to lower the transfer arm in an oblique direction.

According to yet another aspect, the present invention is a substrate transfer apparatus including a transfer arm for transferring a substrate and a mounting means for receiving the substrate transferred by the transfer arm from the transfer arm, including: a support pin raised and lowered with respect to a mounting portion of the mounting means by a raising and lowering means, for delivering the substrate to the mounting means; a moving means for raising and lowering and moving in a horizontal direction the transfer arm; a head portion detector provided at the transfer arm for detecting a head portion of the support pin; and a control means for controlling the moving means based on a detection signal from the head portion detector and controlling the raising and lowering means. In addition, when the substrate transferred by the transfer arm is delivered to the mounting means, the head portion detector detects the head portion of the support pin, then the moving means is driven based on a control signal from the control means to lower the transfer arm in an oblique direction, and then the raising and lowering means is driven to lower the support pin.

According to further another aspect, the present invention is a substrate transfer apparatus including a transfer arm for transferring a substrate and a mounting means for receiving the substrate transferred by the transfer arm from the transfer arm, including: a mounting portion detector provided at the transfer for detecting a mounting portion of the mounting means; a moving means for raising and lowering and moving in a horizontal direction the transfer arm; and a control means for controlling the moving means based on a detection signal from the mounting portion detector. In addition, when the substrate transferred by the transfer arm is delivered to the mounting means, the mounting portion detector detects the mounting portion of the mounting means, and then the moving means is driven based on a control signal from the control means to move the transfer arm in the horizontal direction along a forward direction of movement of the transfer arm and then lower the transfer arm in a vertical direction.

The above substrate transfer apparatus may further includes a jump-up detector provided at the transfer arm for detecting presence or absence of jump-up of the substrate in a state where the substrate is mounted on the mounting means; and a control means for controlling the moving means based on a detection signal from the jump-up detector. In addition, in this case, when the jump-up of the substrate mounted on the mounting means is detected by the jump-up detector, the moving means is driven based on the control signal from the control means to cause the transfer arm to raise the substrate once and then lower the substrate to mount the substrate on the mounting means.

Note that the substrate transfer apparatus may further include a warning means for issuing warning when the jump-up of the substrate is detected.

According to the present invention, slippage of the substrate due to the inertial force accompanying the movement of the transfer arm can be suppressed, so that the substrate can be mounted at a predetermined position on the mounting means. Accordingly, the subsequent treatment of the substrate can be performed at a high speed and with a high accuracy. Further, the displacement of the substrate on the mounting means due to the slippage can be corrected.

Furthermore, when the jump-up is detected, the transfer arm raises the substrate once and then lower it again to mount it on the mounting means, thereby enabling handling of the case where the substrate jumps-up when it is mounted onto the mounting means so that the substrate can be mounted while it is positioned on the mounting means. Warning can be issued when the jump-up is detected, thereby notifying the external part that the substrate jumps-up when it is mounted onto the mounting means.

DETAILED DESCRIPTION OF THE PREFERRED EMBODIMENT

Hereinafter, preferred embodiments of the present invention will be described in detail with reference to the accompanying drawings. Here, a case where a substrate transfer apparatus according to the present invention is employed in a resist solution coating and developing treatment system for a semiconductor wafer will be described.

Figure 1:
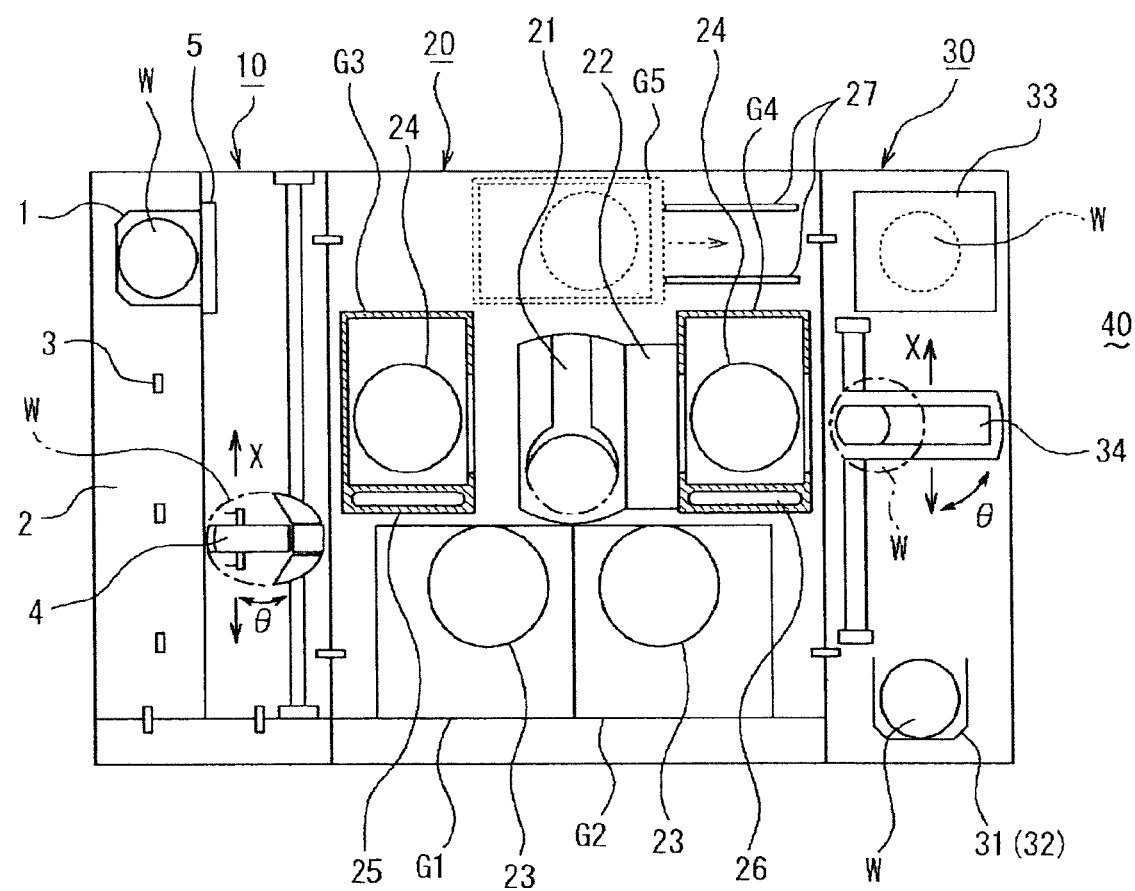
FIG. 1 is a schematic plan view showing an example of a resist solution coating and developing treatment system in which a substrate transfer apparatus according to an embodiment is installed.
Figure 2:
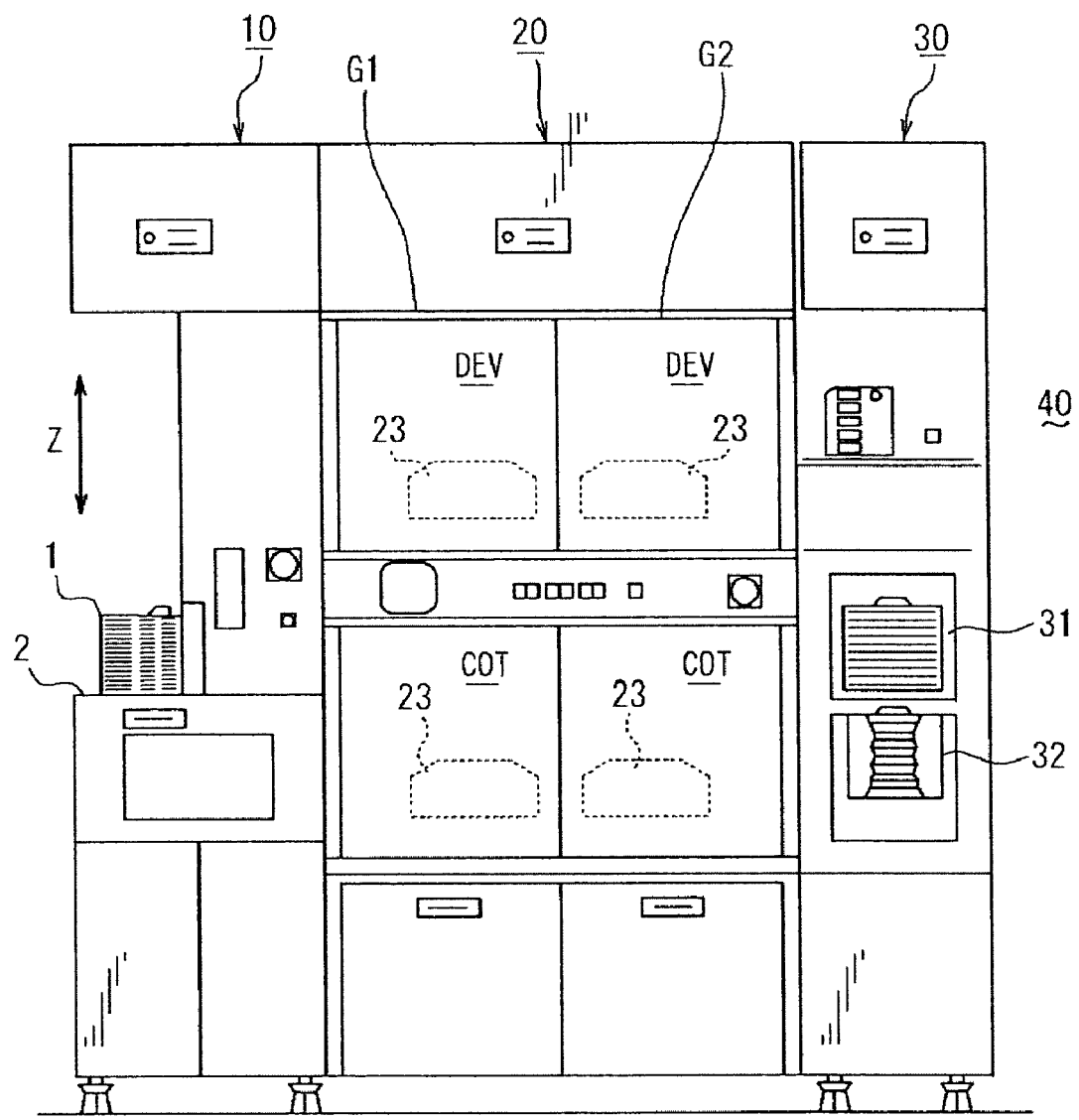
FIG. 2 is a schematic front view of the resist solution coating and developing treatment system in FIG. 1.
Figure 3:
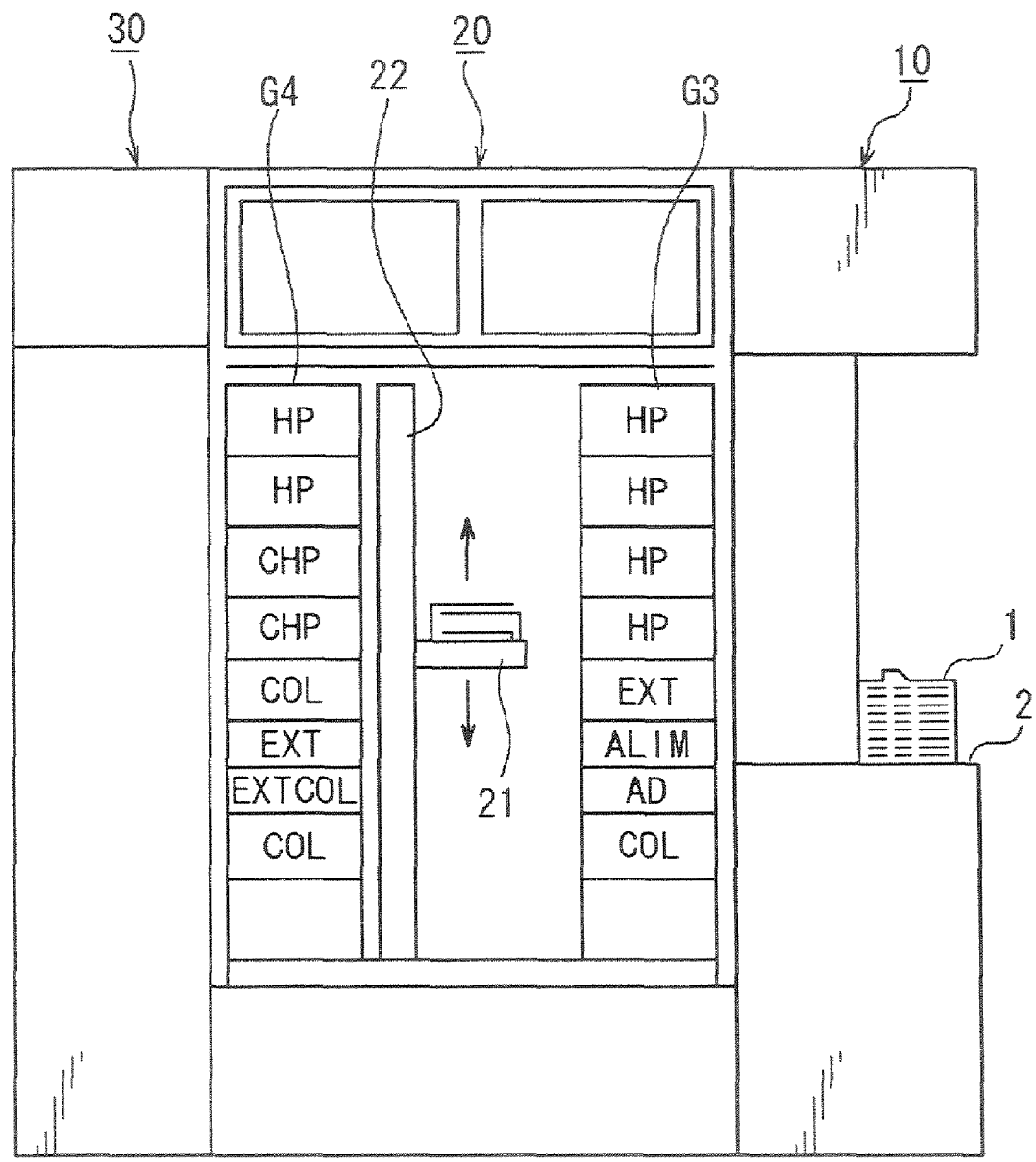
FIG. 3 is a schematics rear view of the resist solution coating and developing treatment system in FIG. 1.

FIG. 1 is a schematic plan view showing an example of the resist solution coating and developing treatment system, FIG. 2 is a schematic front view of FIG. 1, and FIG. 3 is a schematics rear view of FIG. 1.

The primary part of the resist solution coating and developing treatment system is composed of a cassette station 10 (transfer section) for carrying-in/out a plurality of, for example, 25 wafers W (hereinafter referred to as wafers W) being substrates to be treated, as a unit, in a wafer cassette 1 from/to the outside to/from the system, and carrying-in/out the wafers W from/to the wafer cassette 1; a treatment station 20 comprising treatment apparatuses composed of various kinds of multi-tiered treatment units disposed at predetermined positions for performing, in a single wafer treatment manner, predetermined treatments for the wafers W one by one in the coating and developing steps; and an interface section 30 for delivering the wafer W to/from an aligner (not shown) provided adjacent to the treatment station 20.

The cassette station 10 is configured, as shown in FIG. 1, such that a plurality of, for example, up to four wafer cassettes 1 with a lid are mounted at projections 3 on a cassette mounting table 2 in a line along a horizontal X-direction with the respective wafer ports facing toward the treatment station 20 side, a lid open/close device 5 is disposed facing each of the wafer cassettes 1, and a wafer transfer arm 4 (also referred to as a pair of tweezers), which is movable in a cassette-arrangement direction (an X-direction) and in a wafer-arrangement direction (a Z-direction) of the wafers W housed along a vertical direction (the perpendicular direction) in the wafer cassette 1, selectively transfers the wafer W from/to each of the wafer cassettes 1. The wafer transfer arm 4 is also configured to be rotatable in a θ-direction and can transfer the wafer W to an alignment unit (ALIM) and an extension unit (EXT) included in a multi-tired unit section in a later-described third group G3 on the treatment station 20 side.

In the treatment station 20, as shown in FIG. 1, a vertical transfer-type main wafer transfer mechanism 21 comprising a later-described wafer transfer arm 50 vertically perpendicularly) moving by means of a moving mechanism 22 is provided at its central portion, and all of the treatment units are multi-tiered in one or more groups around the main wafer transfer mechanism 21. In this example, five groups G1, G2, G3, G4 and G5 have multi-tier arrangement, the multi-tiered units in the first and second groups G1 and G2 being arranged side by side on the front side of the system, the multi-tiered units in the third group G3 being arranged adjacent to the cassette station 10, the multi-tiered units in the fourth group G4 being arranged adjacent to the interface section 30, and the multi-tiered units in the fifth group G5 being arranged on the rear side.

In this case, as shown in FIG. 2, in the first group G1, a developing unit (DEV) for developing a resist pattern with the wafer W facing a developing solution supply means (not shown) in a cup (container) 23, and a resist coating unit (COT) for performing a predetermined treatment with the wafer W mounted on a spin chuck (not shown), are stacked at two tiers vertically in order from the bottom. In the second group G2, two units, that is, a resist coating units (COT) and a developing unit (DEV) are similarly stacked at two tiers vertically in order from the bottom. The reason why the resist coating unit (COT) is disposed at the lower tier side as described above is that drainage of the resist solution is troublesome in terms of mechanism and maintenance. However, it is also possible to dispose the coating unit (COT) at the upper tier if necessary.

As shown in FIG. 3, in the third group G3, oven-type treatment units each performing a predetermined treatment with the wafer W mounted on a wafer mounting table 24, such as a cooling unit (COL) for cooling the wafer W, an adhesion unit (AD) for performing hydrophobic treatment for the wafer W, an alignment unit (ALIM) for performing alignment of the wafer W, an extension unit (EXT) for carrying-in/out the wafer W, four hot plate units (HP) each for balking the wafer W are stacked, for example, at eight tiers vertically in order from the bottom. Similarly, in the fourth group G4, oven-type treatment units, such as a cooling unit (COL), an extension and cooling unit (EXTCOL), an extension unit (EXT), a cooling unit (COL), two chilling and hot plate units (CHP) each having a rapid cooling function, and two hot plate units (HP) are stacked, for example, at eight tiers vertically in order from the bottom.

As described above, the cooling units (COL) and the extension and cooling unit (EXTCOL) with low treatment temperatures are disposed at lower tiers, and the hot plate units (HP), the chilling and hot plate units (CHP) and the adhesion unit (AD) with high treatment temperatures are disposed at upper tiers, thus enabling less mutual thermal interference between the units. As a matter of course, a random multi-tier arrangement is also possible.

Note that as shown in FIG. 1, in the treatment station 20, the side walls of the multi-tiered units (the oven-type units) in the third and fourth groups G3 and G4 adjacent to the multi-tiered units (the spinner-type units) in the first and second groups G1 and G2, are provided with ducts 25 and 26 which are longitudinally positioned in the vertical direction, respectively. Through theses ducts 25 and 26, downflow clean air or specifically temperature-controlled air flows. The duct structure blocks the heat generated in the oven-type treatment units in the third and fourth groups G3 and G4 to prevent the heat from reaching the spinner-type treatment units in the first and second groups G1 and G2.

Further, in the treatment system, multi-tiered units in a fifth group G5 can be arranged as shown by a dotted line in FIG. 1 on the rear side of the main wafer transfer mechanism 21. The multi-tiered units in the fifth group G5 can be moved along guide rails 27 in the lateral direction as seen from the main wafer transfer mechanism 21. Accordingly, even if the multi-tiered units in the fifth group G5 are provided, the maintenance operation can be easily performed for the main wafer transfer mechanism 21 from the rear side because a space can be secured by sliding the units.

The interface section 30 has the same dimension as that of the treatment station 20 in the depth direction but has a smaller size than the treatment station 20 in the width direction. In the interface section 30, a transportable pick-up cassette 31 and a stationary buffer cassette 32 are two-tiered at the front portion, an edge exposure apparatus 33 being an exposure means for performing exposure for the edge portion of the wafer W and for the identification mark region is disposed at the rear portion, and a transfer arm 34 being a transfer means is disposed at the central portion. The transfer arm 34 is configured to move in the X- and Z-directions to perform transfer to both the cassettes 31 and 32 and to the edge exposure apparatus 33. The transfer arm 34 is also configured to be rotatable in the θ-direction to be able to perform transfer to the extension unit (EXT) included in the fourth group G4 on the treatment station 20 side and to a wafer delivery table (not shown) on the exposure apparatus side adjacent thereto.

The treatment system configured as described above is installed in a clean room 40, so that the cleanliness in each unit is increased by an efficient vertical laminar flow method also in the system.

In the resist solution coating and developing treatment system configured as described above, first of all, the lid open/close device 5 operates to open the lid of a predetermined cassette 1 in the cassette station 10. Next, the wafer transfer arm 4 accesses the cassette 1 housing unprocessed wafers W on the cassette mounting table 2 and takes one wafer W out of the cassette 1. After taking the wafer W out of the cassette 1, the wafer transfer arm 4 moves to the alignment unit (ALIM) disposed in the multi-tiered units in the third group G3 on the treatment station 20 side and places the wafer W onto the wafer mounting table 24 in the unit (ALIM). The wafer W is subjected to orientation flat placement and centering on the wafer mounting table 24. Thereafter, the main wafer transfer mechanism 21 accesses the alignment unit (ALIM) from the opposite side and receives the wafer W from the wafer mounting table 24.

In the treatment station 20, the main wafer transfer mechanism 21 first carries the wafer W into the adhesion unit (AD) included in the multi-tiered units in the third group G3. In the adhesion unit (AD), the wafer W is subjected to the hydrophobic treatment. After completion of the hydrophobic treatment, the main wafer transfer mechanism 21 carries the wafer W out of the adhesion unit (AD) and then carries the wafer W into the cooling unit (COL) included in the multi-tiered units in the third group G3 or the fourth group G4. In the cooling unit (COL), the wafer W is cooled to a set temperature before the resist coating treatment, for example, 23° C. After completion of the cooling treatment, the main wafer transfer mechanism 21 carries the wafer W out of the cooling unit (COL) and then carries the wafer W into the resist coating unit (COT) included in the multi-tiered units in the first group G1 or the second group G2. In the resist coating unit (COT), the wafer W is coated with a resist with a uniform film thickness over the wafer surface by the spin coating method.

After completion of the resist coating treatment, the man wafer transfer mechanism 21 carries the wafer W out of the resist coating unit (COT) and then transferred the wafer W into the hot plate unit (HP). In the hot plate unit (HP), the wafer W is mounted on the mounting table and subjected to pre-baking treatment at a predetermined temperature, for example, 100° C. for a predetermined time. This can evaporate and remove the residual solvent from the coating film on the wafer W. After completion of the pre-baking, the main wafer transfer mechanism 21 carries the wafer W out of the hot plate unit (HP) and then carries the wafer W to the extension and cooling unit (EXTCOL) included in the multi-tiered units in the fourth group G4. In the unit (EXTCOL), the wafer W is cooled to a temperature, for example, 24° C., suitable for the subsequent step, that is, the edge exposure treatment in the edge exposure apparatus 33. After the cooling, the main wafer transfer mechanism 21 carries the wafer W to the extension unit (EXT) immediately above it, and mounts the wafer W on the mounting table (not shown) in the unit (EXT). When the wafer W is mounted on the mounting table in the extension unit (EXT), the transfer arm 34 in the interface section 30 accesses it from the opposite side and receives the wafer W. The transfer arm 34 then carries the wafer W into the edge exposure apparatus 33 in the interface section 30. In the edge exposure apparatus 33, light is applied to the excessive resist film (portion) at the peripheral portion on surface of the wafer W, which is subjected to edge exposure.

After completion of the edge exposure, the transfer arm 34 carries the wafer W out of the casing of the edge exposure apparatus 33 and transports it to a wafer receiving table (not shown) on the adjacent aligner side adjacent thereto. In this case, the wafer W may be temporarily housed in the buffer cassette 32 before being delivered to the aligner.

After exposure of the entire surface in the aligner is finished and the wafer W is returned to the wafer receiving table on the aligner side, the transfer arm 34 in the interface section 30 accesses the wafer receiving table and receives the wafer W, and then carries the received wafer W into the extension unit (EXT) included in the multi-tiered units in the fourth group G4 on the treatment station 20 side and mounts the wafer W on the wafer receiving table. Also in this case, the wafer W may be temporarily housed in the buffer cassette 32 in the interface section 30 before the wafer W is delivered to the treatment station 20 side.

The wafer W mounted on the wafer receiving table is transferred by the main wafer transfer mechanism 21 to the chilling and hot plate unit (CHP) and subjected to post-exposure baking treatment at 120° C. for a predetermined time in order to prevent occurrence of fringe or induce acid catalyst reaction with a chemically amplified resist (CAR).

Thereafter, the wafer W is transferred into the developing unit (DEV) included in the multi-tiered units in the first group G1 or the second group G2. In the developing unit (DEV), the resist on the surface of the wafer W is evenly supplied with the developing solution to be subjected to the developing treatment. This developing treatment develops the resist film formed on the surface of the wafer W in a predetermined circuit pattern and removes the excessive resist film at the peripheral portion of the wafer W, and removes the resist film adhering to the region with an alignment mark M formed (applied) on the surface of the wafer W. After the development is finished as described above, a rinse solution is applied on the surface of the wafer W to wash away the developing solution.

After completion of the developing step, the main wafer transfer mechanism 21 carries the wafer W out of the developing unit (DEV) and then carries the wafer W into the hot plate unit (HP) included in the multi-tiered units in the third group G3 or the fourth group G4. In this unit (HP), the wafer W is subjected to post-baking treatment, for example, at 100° C. for a predetermined time. This hardens the resist swelled by the development, resulting in improved chemical resistance.

After completion of the post-baking, the main wafer transfer mechanism 21 carries the wafer W out of the hot plate unit (HP) and then carries the wafer W into any of the cooling units (COL). After the wafer W is returned to room temperature, the main wafer transfer mechanism 21 transports the wafer W to the extension unit (EXT) included in the third group G3. hen the wafer W is mounted on the mounting table (not shown) in the extension unit (EXT), the wafer transfer arm 4 on the cassette station 10 side accesses it from the opposite side and receives the wafer W. The wafer transfer arm 4 inserts the received wafer W into a predetermined wafer housing groove in the wafer cassette 1 for housing treated wafers on the mounting table, and all of the treated wafers W are housed into the wafer cassette 1, and the lid open/close device 5 then operates to close the lid, with which the treatments end.

Next, the substrate transfer apparatus according to the present invention will be described in detail with reference to FIG. 4 through FIG. 14. Here, transfer of the wafer W by the main wafer transfer mechanism 21 will be described.

Figure 4:
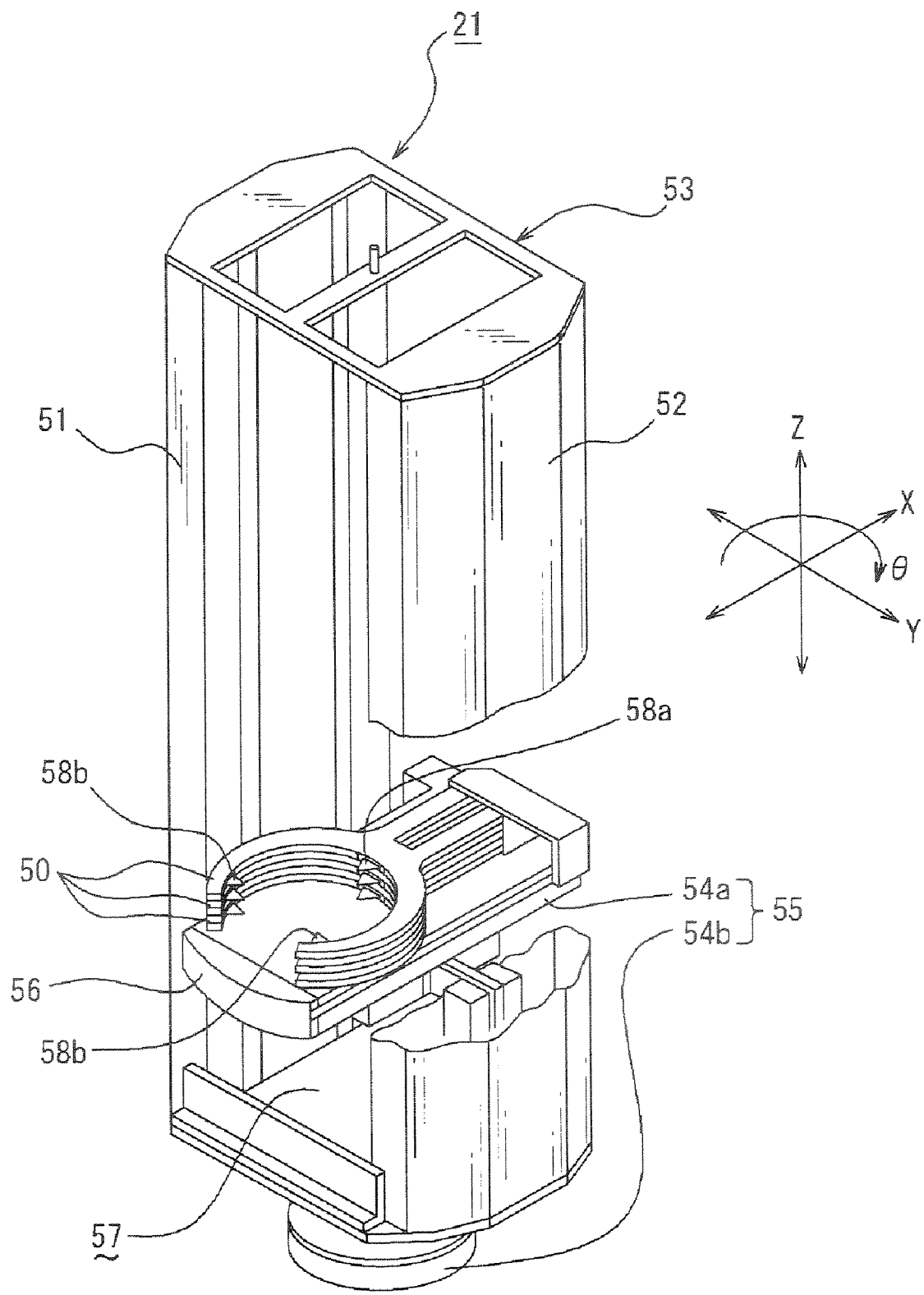
FIG. 4 is a perspective view showing a main transfer apparatus comprising transfer arms in the present invention.

The main wafer transfer mechanism 21, as shown in FIG. 4, has a raising and lowering mechanism 54a which are freely raised and lowered in the vertical direction (the Z-direction) inside a cylindrical support 53 having a pair of wall portions 51 and 52 which are connected to each other at their upper ends and lower ends and opposed to each other. The cylindrical support 53 is also coupled to a rotation shaft of a rotary mechanism 54b such as a motor or the like, so that the cylindrical support 53 is rotated integrally with the raising and lowering mechanism 54a about the rotation shaft by the rotational driving force of the rotary mechanism 54b. Accordingly, the raising and lowering mechanism 54a is rotatable in the θ-direction.

Further, for example, three wafer transfer arms 50 (hereinafter, referred to as transfer arms 50) in the present invention are provided on a transfer base 56 of the raising and lowering mechanism 54a. Any of these three transfer arms 50, 50, and 50 as the transfer means for the wafer W has a shape and size capable of passing through a side opening portion 57 between both wall portions 51 and 52 of the cylindrical support 53, and is movable back and forth in the horizontal direction along the X- and Y-directions by a moving mechanism (not shown) composed of a not-shown driving motor and belt embedded in the transfer base 56.

Accordingly, the transfer arms 50, 50, and 50 are freely raised and lowered in the vertical direction (the Z-direction), movable back and forth along the horizontal directions (the X- and Y-directions), and rotatable in the horizontal directions (the X- and Y-directions).

Figure 5A:
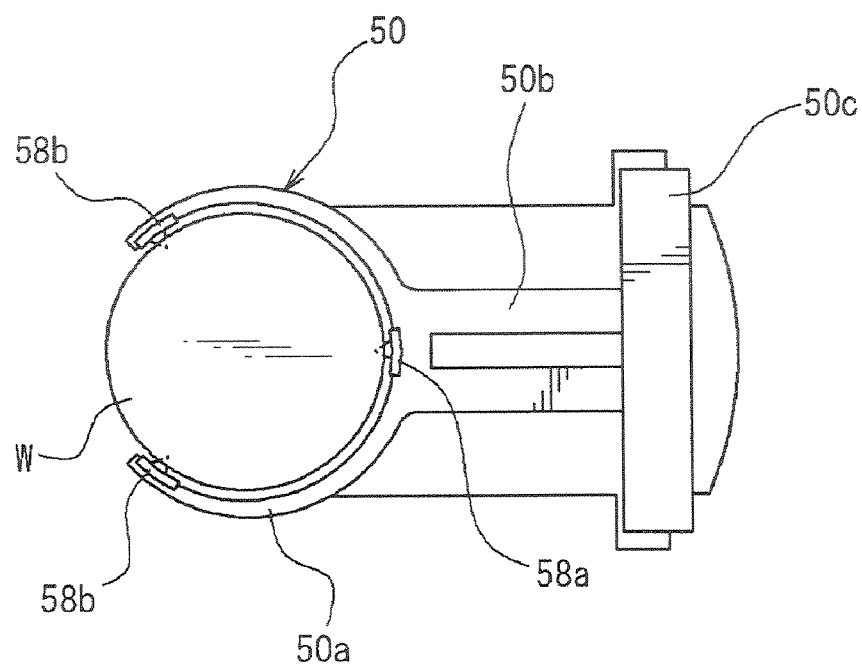
FIG. 5A is a plan view showing the transfer arm in the present invention.
Figure 5B:
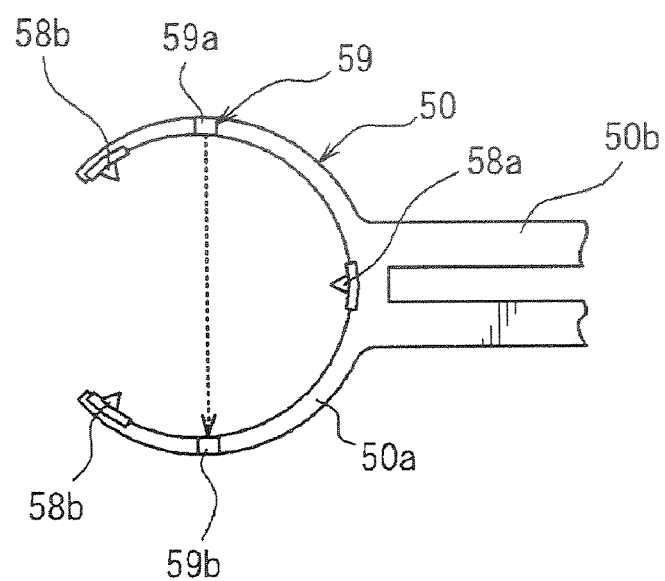
FIG. 5B is a bottom view of its primary part.

These transfer arms 50, 50, and 50 basically have the same configuration, and therefore the transfer arms 50 will be described with reference to the one located at the uppermost position. As shown in FIGS. 5A and 5B, the transfer arm 50 is composed of a frame portion 50a formed in a "C-shape" in an almost ¾ circular ring shape for supporting the peripheral portion of the wafer W, and an arm portion 50b formed integrally with the middle portion of the frame portion 50a and for supporting the frame portion 50a. The moving mechanism (not shown) embedded in the transfer base 56 slides a stay 50c provided at the arm portion 50b to cause the whole transfer arm 50 to move back and forth of the transfer base 56.

The frame portion 50a is provided with three support members 58a, 58b, and 58b, made of a synthetic resin, for example, polyether ether ketone (PEEK), for directly supporting the wafer W. Of these support members 58a, 58b, and 58b, the support member 58a is attached at a position closest to the arm portion 50b, and the support members 58b and 58b are provided near the tip portions of the frame portion 50a, respectively.

A mounting portion detector 59 is attached at positions opposing with respect to an inner center point of the frame portion 50a on the bottom surface of the transfer portion 50a, which detects the mounting means, for example, a mounting portion of a spin chuck 60 in the resist coating unit (COT). The mounting portion detector 59 is composed of, for example, a light emitting element 59a and a light receiving element 59b (see FIG. 5B).

First Embodiment

Figure 6A:
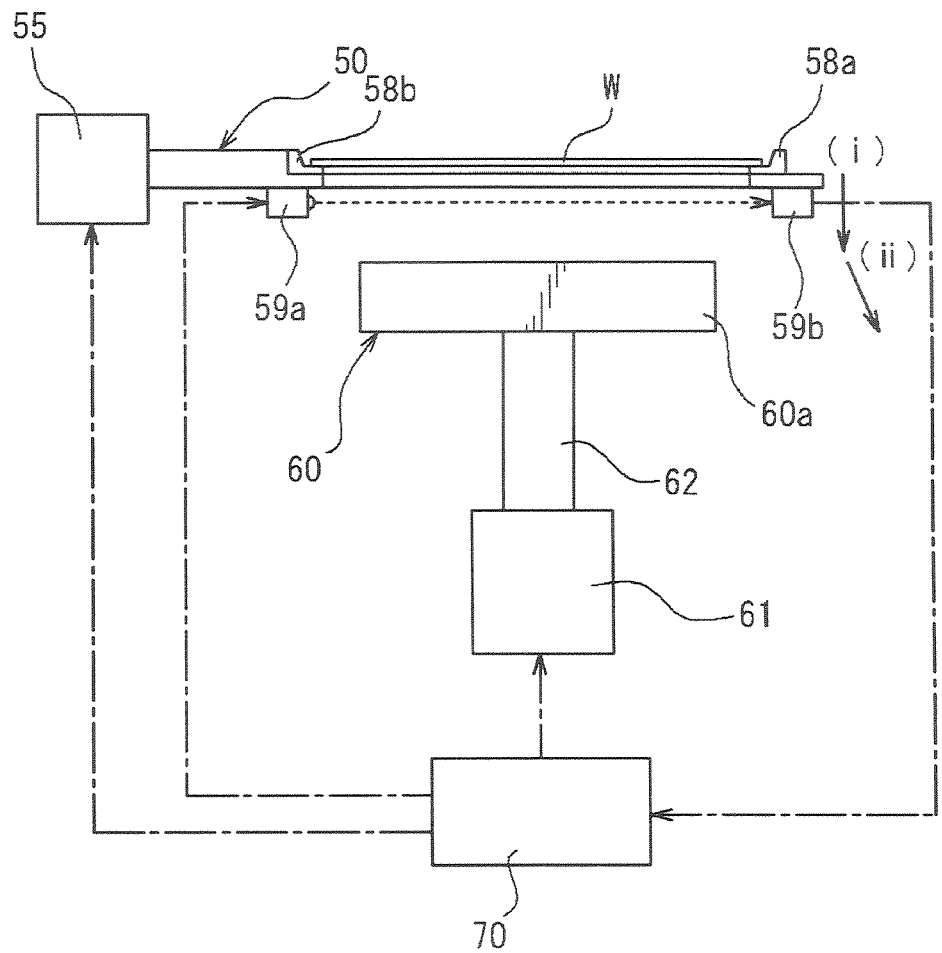
FIG. 6A is a schematic side view of the substrate transfer apparatus of a first embodiment of the present invention.
Figure 6B:
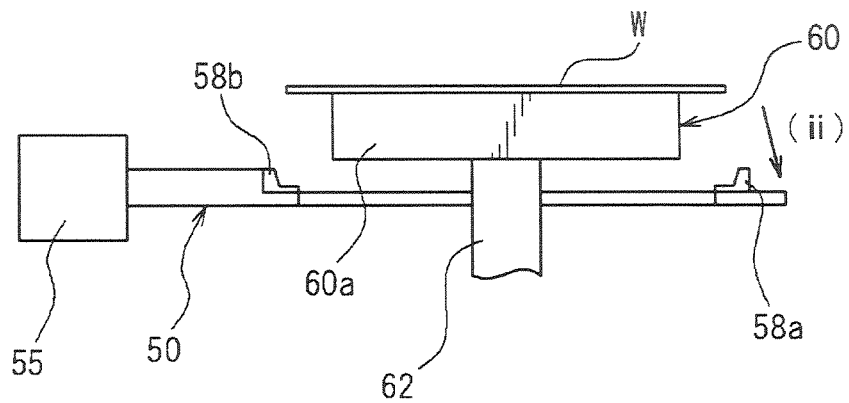
FIG. 6B is a schematic side view showing a state of delivering the substrate.

FIG. 6A is a schematic side view showing a first embodiment of the substrate transfer apparatus according to the present invention, and FIG. 6B is a schematic side view showing a state of delivering the wafer W.

The first embodiment relates to an apparatus for delivering the wafer W, transferred by the transfer arm 50, into the resist coating unit (COT) and delivering the wafer W to the mounting means, that is, the spin chuck 60 disposed in the resist coating unit (COT).

The spin chuck 60 is coupled to a rotation shaft 62 of a motor 61 and is formed to be free rotatable in the horizontal direction by driving of the motor 61. Note that the motor 61 is electrically connected to a control means, for example, a controller 70 such as a central processing unit (CPU), and can rotate at a predetermined number of rotations based on a control signal from the controller 70. A mounting portion 60a of the spin chuck 60 comprises a vacuum suction surface, so that the wafer W is held by suction on the mounting portion 60a of the spin chuck 60 by driving of a not-shown vacuum apparatus.

A moving means 55 and the mounting portion detector 59 are electrically connected to the controller 70. Accordingly, the moving means 55 is controlled based on the control signal from the controller 70, so that the transfer arm 50 is freely raised and lowered in the vertical direction (the Z-direction), movable back and forth along the horizontal directions (the X- and Y-directions), and rotatable in the horizontal directions (the X- and Y-directions). This allows the transfer arm 50 to lower in an oblique direction. The oblique lowering operation of the transfer arm 50 is controlled such that it starts at the point in time of detecting the mounting portion 60a of the spin chuck 60 by the light emitting element 59a and the light receiving element 59b of the mounting portion detector 59.

Figure 7:
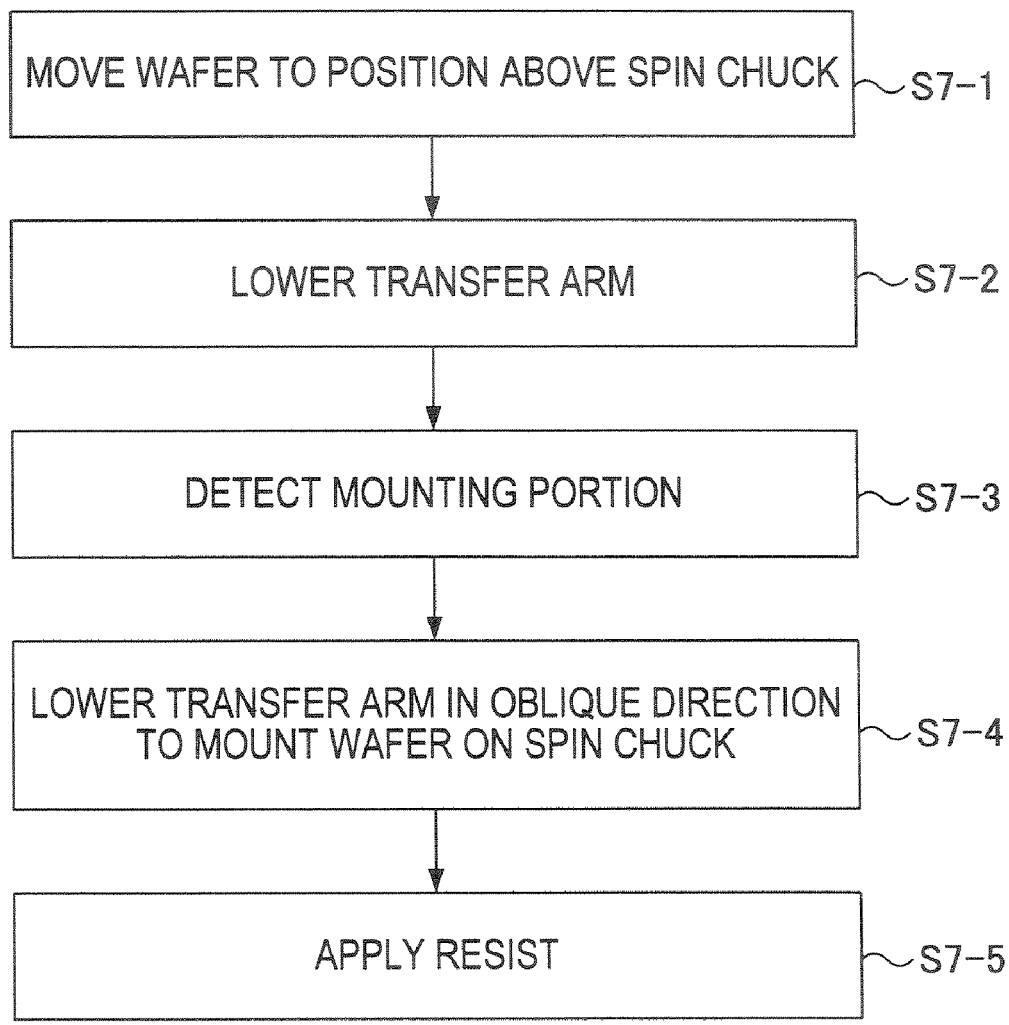
FIG. 7 is a flowchart showing the operation aspect of the substrate transfer apparatus of the first embodiment.

Next, the operation aspect of the substrate transfer apparatus of the first embodiment will be described with reference to FIG. 6A, FIG. 6B and a flowchart shown in FIG. 7.

First of all, the transfer arm 50 carries the wafer W out of the cooling unit (COL) and moves it to a position above the spin chuck 60 in the resist coating unit (COT) (step S7-1). Thereafter, as shown at (i) in FIG. 6A, the transfer arm 50 is lowered in the vertical direction (step S7-2). During the lowering of the transfer arm 50, the mounting portion 60a is detected by the light emitted from the light emitting element 59a of the mounting portion detector 59 being blocked by the mounting portion 60a of the spin chuck 60, and its detection signal is transmitted to the controller 70 (step S7-3). Then, as shown at (ii) in FIG. 6A and FIG. 6B, the moving means 55 of the transfer arm 50 moves based on the control signal from the controller 70 to lower the transfer arm 50 in the oblique direction (step S7-4). This suppresses slippage of the wafer W due to the inertial force accompanying the movement of the transfer arm 50 to the position above the spin chuck 60 and corrects the displacement of the wafer W on the mounting portion 60a of the spin chuck 60 due to the above slippage, and the wafer W is held by suction.

With the wafer W being mounted on the mounting portion 60a of the spin chuck 60, a not-shown resist coating nozzle moves to a position above the wafer W, the resist solution is dropped from the nozzle onto the surface of the wafer W, and the spin chuck 60 rotates, whereby the resist is applied on the surface of the wafer W (step S7-5). After completion of the resist coating treatment, the transfer arm 50 carries the wafer W out of the resist coating unit (COT) and then carries it to the hot plate unit (HP).

Second Embodiment

Figure 8A:
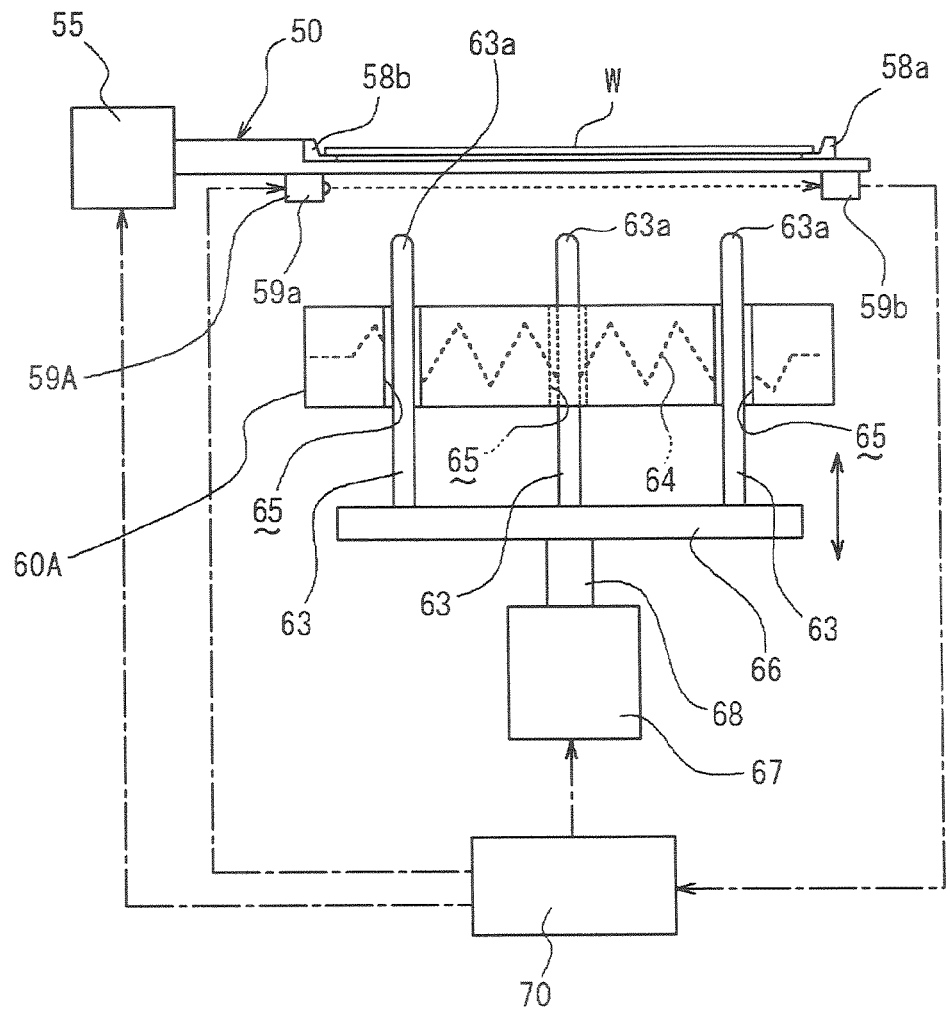
FIG. 8A is a schematic side view of a substrate transfer apparatus of a second embodiment of the present invention.
Figure 8B:
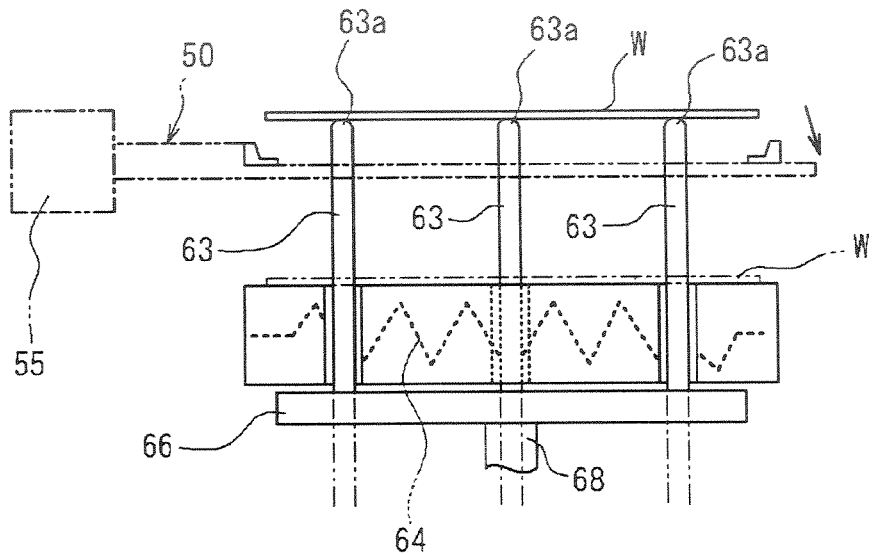
FIG. 8B is a schematic side view showing a state of delivering the substrate in the second embodiment.

FIG. 8A is a schematic side view showing a substrate transfer apparatus according to a second embodiment, and FIG. 8B is a schematic side view showing a state of delivering the wafer W in the second embodiment.

The second embodiment relates to an apparatus for delivering the wafer W, transferred by the transfer arm 50, for example, to a mounting table 60A being the mounting means, which is disposed in the hot plate unit (HP). Here, the transfer arm 50, the moving means 55 of the transfer arm 50, and so on are the same as those of the first embodiment, and therefore the same numerals are given to the same portions to omit their description. Note that a head portion detector 59A is attached at positions opposing with respect to an inner center point of the frame portion 50a on the bottom surface of the transfer arm 50, which detects head portions 63a of later-described support pins 63. The head portion detector 59A is composed of, for example, a light emitting element 59a and a light receiving element 59b, similarly to the above-described mounting portion detector 59.

On the other hand, a heater 64 is embedded in a mounting table 60A so that the wafer W mounted on the mounting table 60A is heated, for example, to 100° C. by the heater 64. Through holes 65 are provided at three locations on a concentric circle of the mounting table 60A. The support pins 63 are inserted in the through holes 65, respectively, such that they can be raised and lowered, and the lower end portions of the three support pins 63 are coupled to a holding member 66. Further, the holding member 66 is coupled to a raising and lowering rod 68 of a raising and lowering means 67, so that driving of the raising and lowering means 67 raises and lowers the support pins 63 to allow the support pins 63 to protrude to positions above the mounting table 60A.

The moving means 55, the head portion detector 59A (the light emitting element 59a and the light receiving element 59b), and the raising and lowering means 67 are electrically connected to the controller 70 so that they are controlled by the control signal from the controller 70.

Figure 9:
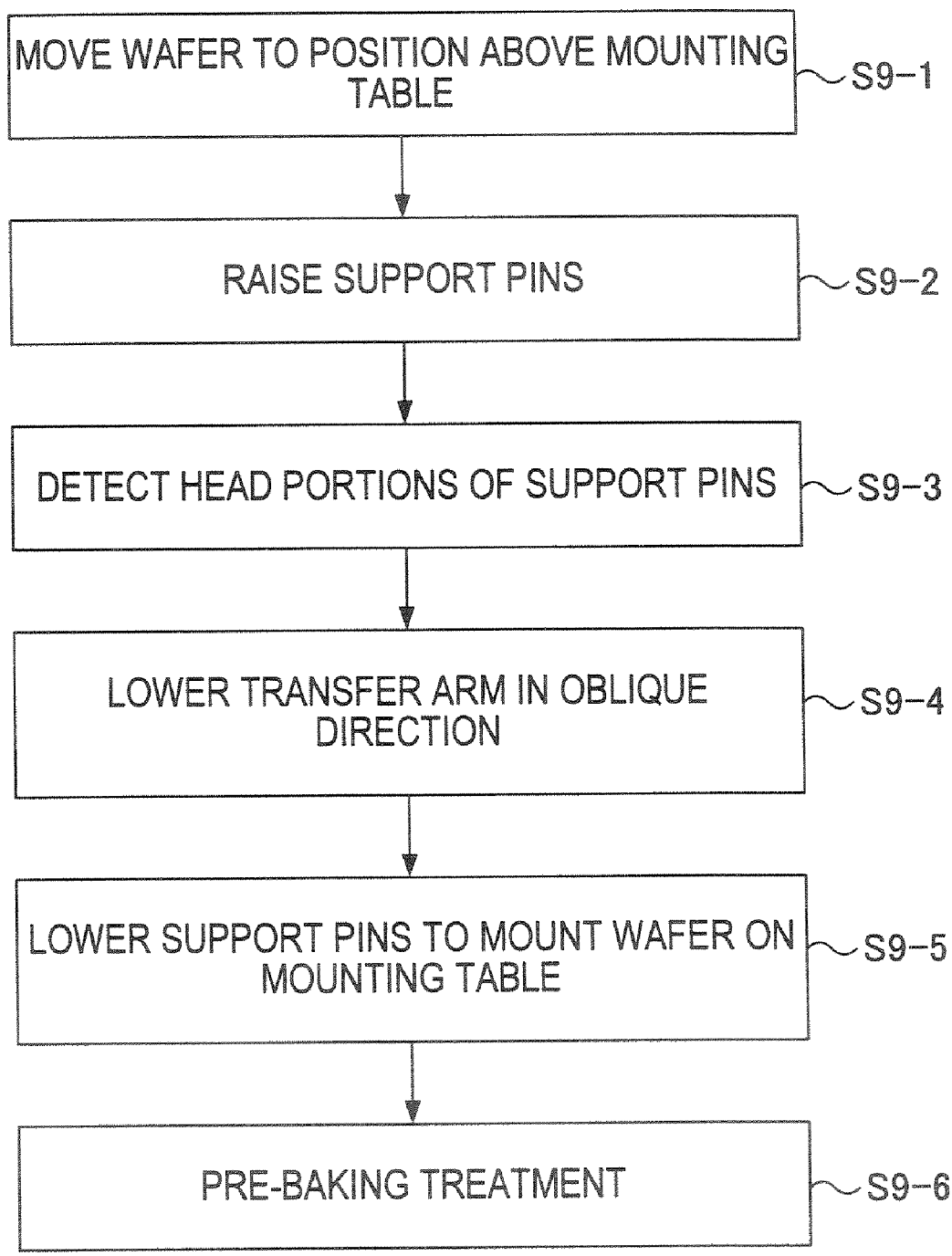
FIG. 9 is a flowchart showing the operation aspect of the substrate transfer apparatus of the second embodiment.

Next, the operation aspect of the second embodiment will be described with reference to FIG. 8A, FIG. 8B and a flowchart shown in FIG. 9.

First of all, the transfer arm 50 carries the wafer W out of the resist coating unit (COT) and moves it to a position above the mounting table 60A in the hot plate unit (HP) (step S9-1). Then, the raising and lowering means 67 operates to raise the support pins 63 (step S9-2) to support the wafer W held by the transfer arm 50. In this event, the head portions 63a are detected by the light emitted from the light emitting element 59a of the head portion detector 59A being blocked by the head portions 63a of the support pins 63, and its detection signal is transmitted to the controller 70 (step S9-3). Then, as shown in FIG. 8B, the moving means 55 of the transfer arm 50 operates based on the control signal from the controller 70 to lower the transfer arm 50 in the oblique direction (step S9-4). This suppresses slippage of the wafer W due to the inertial force accompanying the movement of the transfer arm 50 to the position above the mounting table 60A and corrects the displacement, and the wafer W is supported on the support pins 63. Thereafter, the raising and lowering means 67 operates to lower the support pins 63, whereby the wafer W is mounted on the mounting table 60A (step S9-5).

With the wafer W being mounted on the mounting table 60A, the heater 64 operates to pre-bake the wafer W at a predetermined temperature, for example, 100° C. for a predetermined time (step S9-6). This can evaporate and remove the residual solvent from the coating film on the wafer W. After completion of the pre-baking, the transfer arm 50 carries the wafer W out of the hot plate unit (HP) and then carries the wafer W into the extension and cooling unit (EXTCOL) included in the multi-tiered units in the fourth group G4.

Third Embodiment

Figure 10:
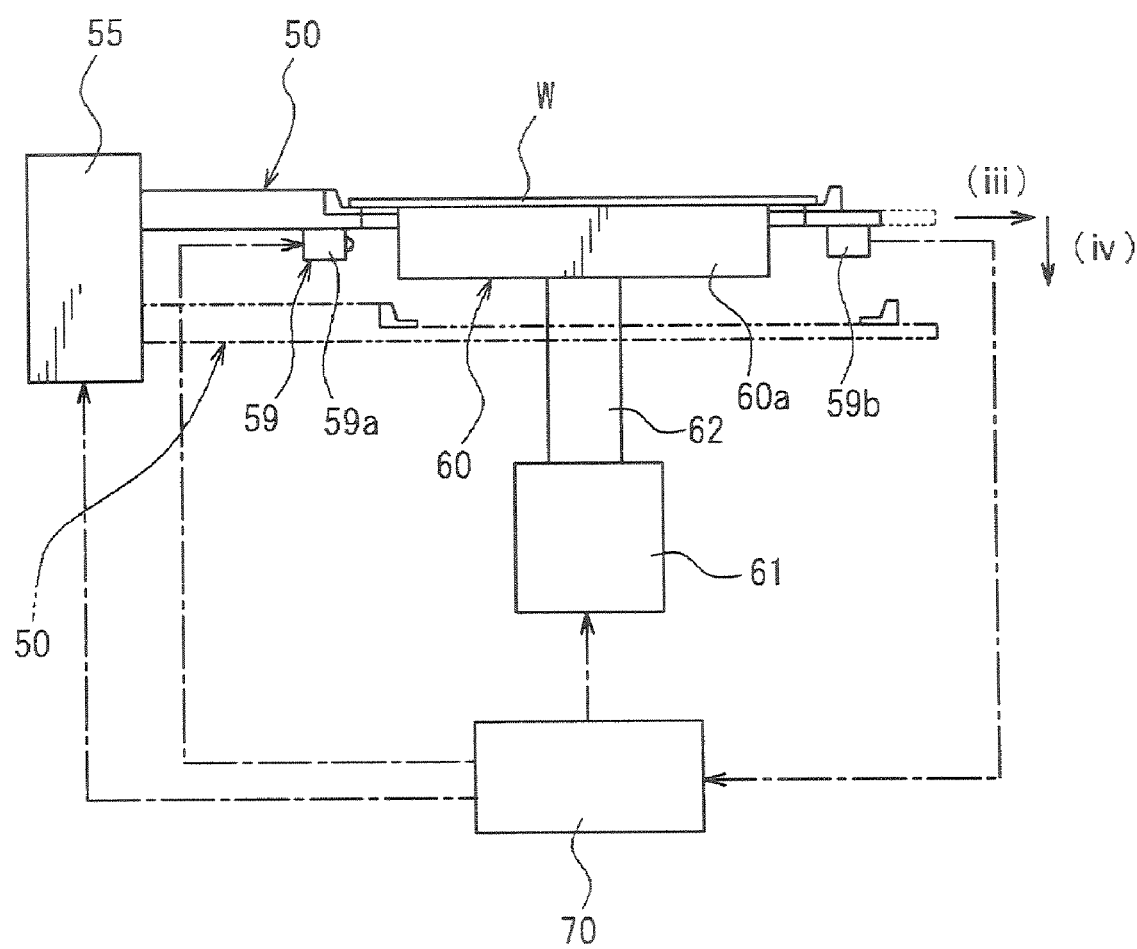
FIG. 10 is a schematic side view of the substrate transfer apparatus of a third embodiment of the present invention.

FIG. 10 is a schematic side view showing a substrate transfer apparatus according to a third embodiment.

The third embodiment, similarly to the first embodiment, relates to an apparatus for delivering the wafer W, transferred by the transfer arm 50, into the resist coating unit (COT) and delivering the wafer W to the mounting means, that is, the spin chuck 60 disposed in the resist coating unit (COT), which is the case with a different operational form at the time of mounting the wafer W on the spin chuck 60. More specifically, as shown in FIG. 10, this is the case where the transfer arm 50 is moved to a position above the spin chuck 60 and mounts the wafer W on the spin chuck 60, and the transfer arm 50 is then moved in the horizontal direction along the forward direction of movement of the transfer arm 50 (iii) and then lowered in the vertical direction (iv).

Note that in the third embodiment, the other portions are the same as those in the first embodiment, and therefore the same numerals are given to the same portions to omit their description.

Figure 11:
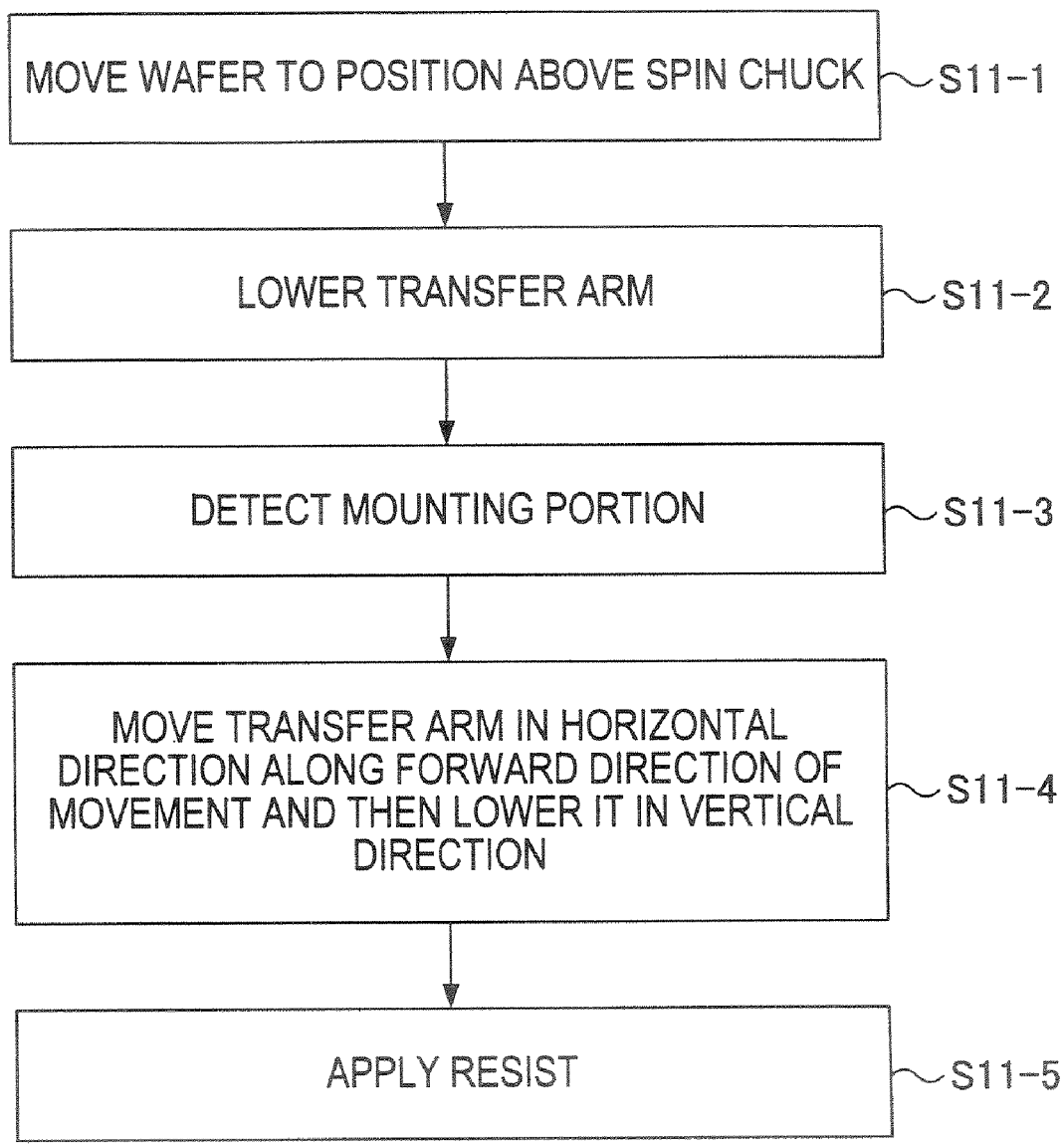
FIG. 11 is a flowchart showing the operation aspect of the substrate transfer apparatus of the third embodiment.

Next, the operation aspect of the third embodiment will be described with reference to FIG. 10 and a flowchart shown in FIG. 11.

First of all, the transfer arm 50 carries the wafer W out of the cooling unit (COL) and moves it to a position above the spin chuck 60 in the resist coating unit (COT) (step S11-1). Thereafter, the transfer arm 50 is lowered in the vertical direction (step S11-2). During the lowering of the transfer arm 50, the mounting portion 60a is detected by the light emitted from the light emitting element 59a of the mounting portion detector 59 being blocked by the mounting portion 60a of the spin chuck 60, and its detection signal is transmitted to the controller 70 (step S11-3). Then, as shown in FIG. 10, the moving means 55 of the transfer arm 50 moves based on the control signal from the controller 70 to move the transfer arm 50 in the horizontal direction along the forward direction of movement of the transfer arm 50 (iii) and then lower it in the vertical direction (iv) (step S11-4). This suppresses slippage of the wafer W due to the inertial force accompanying the movement of the transfer arm 50 to the position above the spin chuck 60 and corrects the displacement of the wafer W on the mounting portion 60a of the spin chuck 60 due to the above slippage, and the wafer W to be held by suction.

With the wafer W being mounted on the mounting portion 60a of the spin chuck 60, the not-shown resist coating nozzle moves to a position above the wafer W, the resist solution is dropped from the nozzle onto the surface of the wafer W, and the spin chuck is 60 rotated, whereby the resist is applied on the surface of the wafer W (step S11-5). After completion of the resist coating treatment, the transfer arm 50 carries the wafer W out of the resist coating unit (COT) and then carries it to the hot plate unit (HP).

Fourth Embodiment

Figure 12:
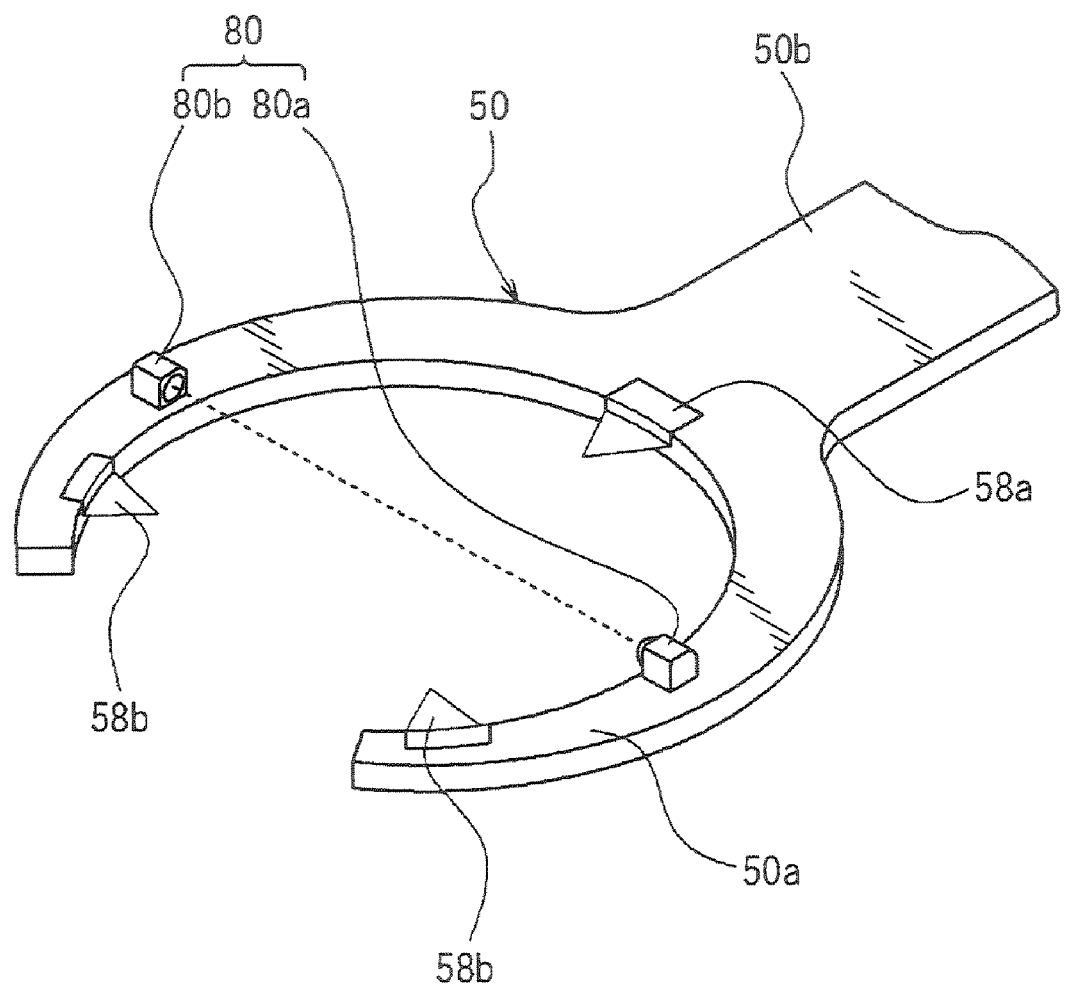
FIG. 12 is a schematic perspective view showing a transfer arm of a substrate transfer apparatus of a fourth embodiment of the present invention.
Figure 13A:
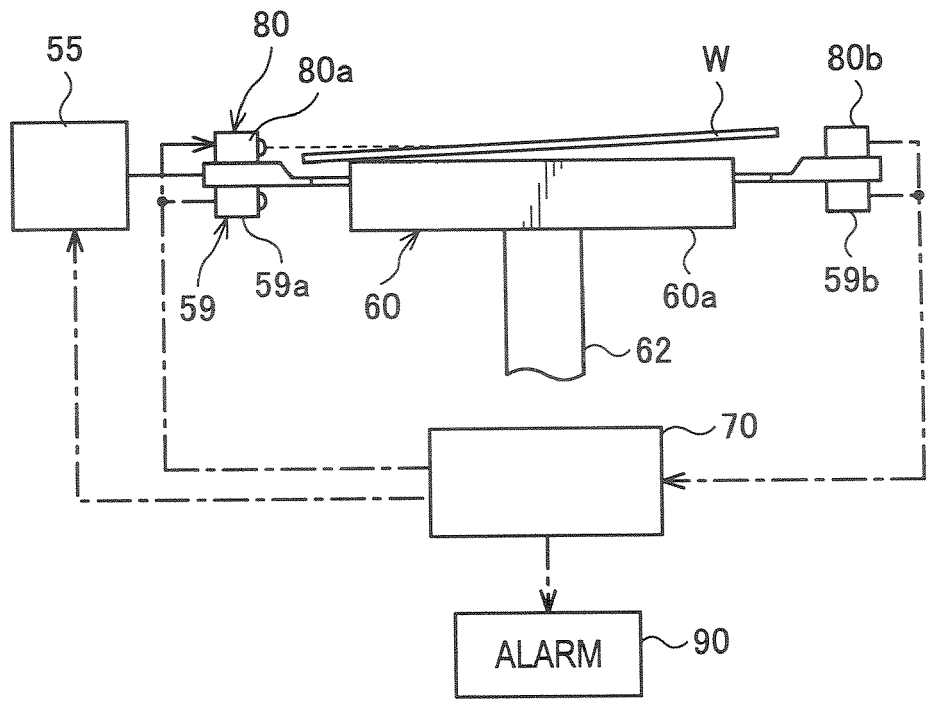
FIG. 13A is a schematic side view showing a substrate transfer apparatus of the fourth embodiment.
Figure 13B:
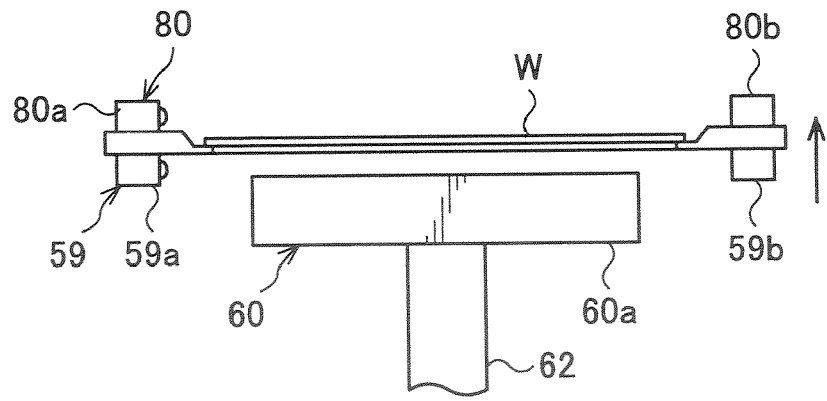
FIG. 13B is a schematic side view of a primary part showing a state in which the transfer arm is raised with an inadequate mounting state.
Figure 13C:
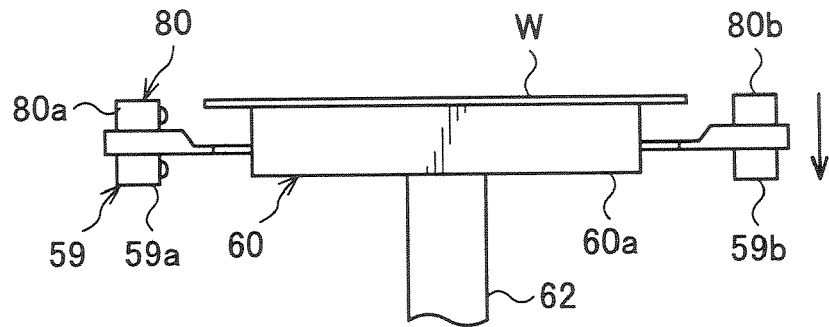
FIG. 13C is a schematic side view of a primary part showing a state in which the transfer arm is lowered again.

FIG. 12 is a schematic perspective view showing a transfer arm in a fourth embodiment, FIG. 13A is a schematic side view showing a substrate transfer apparatus of the fourth embodiment, FIG. 13B is a schematic side view of a primary part showing a state in which the transfer arm is raised with an inadequate mounting state, and FIG. 13C is a schematic side view of a primary part showing a state in which the transfer arm is lowered again.

The fourth embodiment is an example adapted to the case in which adequate mounting is not performed for the wafer W which should be mounted on the spin chuck 60 being the mounting means because of its jump-up in the first and third embodiment. More specifically, the fourth embodiment is an example in which the transfer arm 50 is provided with a jump-up detector 80 for detecting jump-up of the wafer W mounted on the spin chuck 60, and comprises a function of adapting to the case where jump-up occurs.

In the fourth embodiment, the jump-up detector 80 is attached at positions opposing with respect to an inner center point of the frame portion 50a on the top surface of the frame portion 50a of the transfer arm 50, which detects the jump-up of the wafer W mounted on the spin chuck 60 being the mounting means. The jump-up detector 80 has, for example, a light emitting element 80a and a light receiving element 80b (see FIG. 12). The jump-up detector 80 is electrically connected to the controller 70, so that when the jump-up detector 80 detects the jump-up of the wafer W mounted on the spin chuck 60, its detection signal is transmitted to the controller 70. Further, a warning means, for example, an alarm 90 is electrically connected to the controller 70, so that when the jump-up detector 80 detects the jump-up of the wafer W mounted on the spin chuck 60, the alarm 90 issues warning based on the signal from the controller 70.

Note that, in the fourth embodiment, the other portions are the same as those in the first embodiment, and therefore the same numerals are given to the same portions to omit their description.

Figure 14:
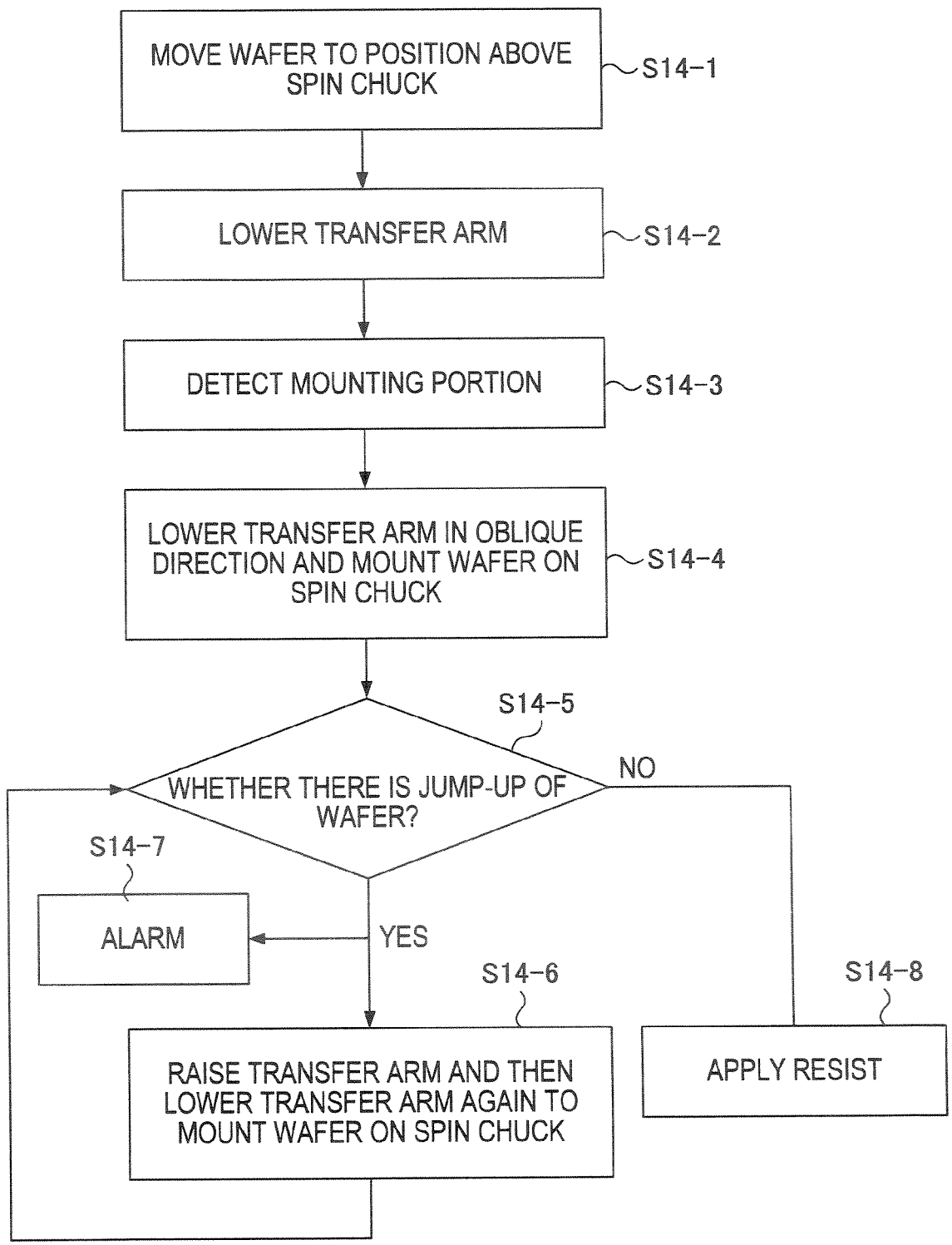
FIG. 14 is a flowchart showing the operation aspect of the substrate transfer apparatus of the fourth embodiment.

Next, the operation aspect of the fourth embodiment will be described with reference to FIGS. 13A to 13C and a flowchart shown in FIG. 14.

First of all, the transfer arm 50 carries the wafer W out of the cooling unit (COL) and moves it to a position above the spin chuck 60 in the resist coating unit (COT) (step S14-1). Thereafter, the transfer arm 50 is lowered in the vertical direction (step S14-2). During the lowering of the transfer arm 50, the mounting portion 60a is detected by the light emitted from the light emitting element 59a of the mounting portion detector 59 being blocked by the mounting portion 60a of the spin chuck 60, and its detection signal is transmitted to the controller 70 (step S14-3). Then, the moving means 55 of the transfer arm 50 moves based on the control signal from the controller 70 to lower the transfer arm 50 in the oblique direction and mount the wafer W on the spin chuck 60 (step S14-4). In this event, the jump-up detector 80 detects the presence or absence of the jump-up of the wafer W (step S14-5). If the detection finds jump-up of the wafer W, a detection signal is transmitted to the controller 70. Based on the control signal from the controller 70, the moving means 55 operates to raise the transfer arm 50 to thereby raise the wafer W mounted on the spin chuck 60 to a position above the spin chuck 60, and the transfer arm 50 is then lowered again to mount the wafer W on the spin chuck 60 (step S14-6). In this event, the jump-up detector 80 detects the presence or absence of the jump-up of the wafer W (step S14-5). Further, if there is jump-up of the wafer W, a signal from the controller 70 is transmitted to the alarm 90 to issue warning (step S14-7).

If jump-up of the wafer W mounted on the spin chuck 60 is not detected, it is verified that the wafer W has been appropriately mounted on the spin chuck 60. With the wafer W being mounted on the mounting portion 60a of the spin chuck 60, the not-shown resist coating nozzle moves to a position above the wafer W, the resist solution is dropped from the nozzle onto the surface of the wafer W, and the spin chuck 60 is rotated, whereby the resist is applied on the surface of the wafer W (step S14-8). After completion of the resist coating treatment, the transfer arm 50 carries the wafer W out of the resist coating unit (COT) and then carries it to the hot plate unit (HP).

While the case in which the substrate transfer apparatus according to the present invention is applied to the main wafer transfer mechanism 21 and the resist coating unit (COT) or the hot plate unit (HP) in the treatment station 20 in the resist solution coating and developing treatment system has been described in the above embodiments, the substrate transfer apparatus is also applicable to the main wafer transfer mechanism 21 and transfer of the wafer W in the other treatment units. Further, the substrate transfer apparatus is also applicable to transfer of the wafer W between the transfer arm 34 and the edge exposure apparatus 33 in the interface section 30 other than the treatment station 20.

While the case in which the substrate transfer apparatus according to the present invention is applied in the heating treatment unit in the resist solution coating and developing treatment system for the semiconductor wafer has been described in the above embodiments, the substrate transfer apparatus is also applicable to a substrate transfer apparatus in a resist solution coating and developing treatment system for an LCD glass substrate as a matter of course.

What is claimed is:

1. A substrate transfer method of delivering a substrate transferred by a transfer arm to a mounting means, comprising the steps of:

moving the transfer arm to a position above the mounting means, and delivering the substrate onto the mounting means such that the transfer arm is lowered in an oblique direction to mount the substrate on the mounting means;

detecting presence or absence of jump-up of the substrate in a state where the substrate is delivered on the mounting means by a substrate jump-up detector provided at the transfer arm; and if the jump-up is detected, raising the substrate once and then lowering the substrate by the transfer arm to mount the substrate on the mounting means.

2. The substrate transfer method as set forth in claim 1, further comprising the step of:

issuing warning if the jump-up is detected when detecting presence or absence of jump-up of the substrate in a state where the substrate is delivered on the mounting means by a substrate jump-up detector provided at the transfer arm.

3. A substrate transfer apparatus comprising a transfer arm for transferring a substrate and a mounting means for receiving the substrate transferred by the transfer arm from the transfer arm, comprising:

a mounting portion detector provided at said transfer arm for detecting a mounting portion of said mounting means;

a moving means for raising and lowering and moving in a horizontal direction said transfer arm;

a control means for controlling said moving means based on a detection signal from said mounting portion detector;

a jump-up detector provided at said transfer arm for detecting presence or absence of jump-up of the substrate in a state where the substrate is mounted on said mounting means; and a control means for controlling said moving means based on a detection signal from said jump-up detector, wherein when the substrate transferred by said transfer arm is delivered to said mounting means, said mounting portion detector detects the mounting portion of said mounting means, and then said moving means is driven based on a control signal from said control means to lower said transfer arm in an oblique direction, and wherein when the jump-up of the substrate mounted on said mounting means is detected by said jump-up detector, said moving means is driven based on the control signal from said control means to cause said transfer arm to raise the substrate once and then lower the substrate to mount the substrate on said mounting means.

4. The substrate transfer apparatus as set forth in claim 3, further comprising:

a warning means for issuing warning based on the control signal from said control means when the jump-up of the substrate mounted on said mounting means is detected.

5. A substrate transfer apparatus comprising a transfer arm for transferring a substrate and a mounting means for receiving the substrate transferred by the transfer arm from the transfer arm, comprising:

a mounting portion detector provided at said transfer arm for detecting a mounting portion of said mounting means;

a moving means for raising and lowering and moving in a horizontal direction said transfer arm;

a control means for controlling said moving means based on a detection signal from said mounting portion detector;

a jump-up detector provided at said transfer arm for detecting presence or absence of jump-up of the substrate in a state where the substrate is mounted on said mounting means; and a control means for controlling said moving means based on a detection signal from said jump-up detector, wherein when the substrate transferred by said transfer arm is delivered to said mounting means, said mounting portion detector detects the mounting portion of said mounting means, and then said moving means is driven based on a control signal from said control means to move said transfer arm in the horizontal direction along a forward direction of movement of said transfer arm and then lower said transfer arm in a vertical direction, and wherein when the jump-up of the substrate mounted on said mounting means is detected by said jump-up detector, said moving means is driven based on the control signal from said control means to cause said transfer arm to raise the substrate once and then lower the substrate to mount the substrate on said mounting means.

6. The substrate transfer apparatus as set forth in claim 5, further comprising:

a warning means for issuing warning based on the control signal from said control means when the jump-up of the substrate mounted on said mounting means is detected.

* * * * *